United States Patent [19]

Fender

[11] 4,002,994
[45] Jan. 11, 1977

[54] TONE CONTROL CIRCUIT

[76] Inventor: C. Leo Fender, 2851 Rolling Hills Drive Sp. 33, Fullerton, Calif. 92635

[22] Filed: Jan. 26, 1976

[21] Appl. No.: 652,409

[52] U.S. Cl. .............................. 330/107; 84/1.14; 179/1 D; 330/109
[51] Int. Cl.² ...................... H03F 1/36; G10H 3/00
[58] Field of Search ............ 84/1.1, 1.14; 179/1 D, 179/100.1 TC; 330/107, 109; 333/28 T

[56] References Cited
UNITED STATES PATENTS

| | | | |
|---|---|---|---|
| 2,500,493 | 3/1950 | Holst | 333/28 T |
| 3,454,702 | 7/1969 | Elbrecht | 84/1.14 |
| 3,891,938 | 6/1975 | Mickhael et al. | 330/107 |
| 3,914,716 | 10/1975 | Kurata | 330/107 X |

*Primary Examiner*—R. V. Rolinec
*Assistant Examiner*—Lawrence J. Dahl
*Attorney, Agent, or Firm*—Philip M. Hinderstein

[57] ABSTRACT

A tone control circuit comprising an operational amplifier having an input and an output and a negative feedback circuit connected between the output and the input, the feedback circuit including a plurality of resistors and capacitors for controlling the magnitude of the high and low frequency components fed back to the input of the operational amplifier to selectably provide low frequency boost and high frequency boost or cut, the circuit having a high input impedance, a low output impedance, gain, and a relatively constant phase shift.

14 Claims, 1 Drawing Figure

U.S. Patent
Jan. 11, 1977
4,002,994
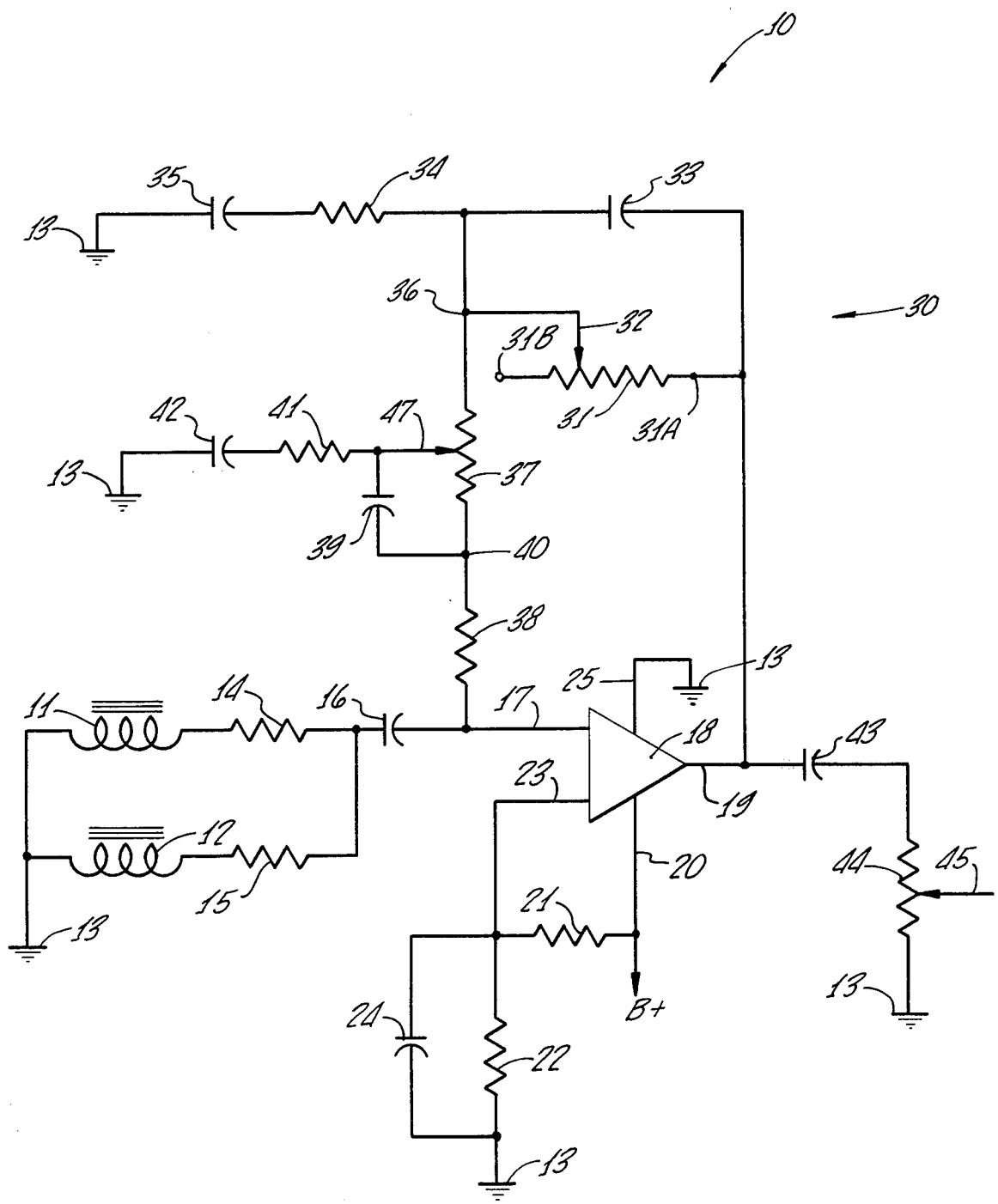

TONE CONTROL CIRCUIT

BACKGROUND OF THE INVENTION

1. Field of the Invention

The present invention relates to a tone control circuit and, more particularly, to a tone control circuit having a high input impedance, a low output impedance, gain, and a relatively constant phase shift.

2. Description of the Prior Art

Most music applications require bass and treble tone controls and a number of tone control circuits have been developed. Typical tone control circuits are attenuation circuits and, due to the insertion loss of the circuit, it has been normal to use one or more preamplifiers therewith. However, a variety of other problems make such tone control circuits unsuitable for a variety of applications.

For example, in a stringed instrument, such as an electric guitar, it is usually necessary to sum the outputs of a plurality of pick up coils before application to the tone control circuit. Therefore, the tone control circuit must have a high input impedance to prevent distortion of the output of the coils. Furthermore, the input of the tone control circuit must provide a virtual ground to prevent interference between the multiple pick up coils. However, tone control circuits with high input impedances have not been generally available heretofore.

In the case of an electric stringed instrument, where the output of the tone control circuit is conducted over a long cable to an amplifier system, it is necessary that the tone control circuit have a low output impedance. If the tone control circuit has a high output impedance, the cable acts as an antenna and introduces a significant amount of noise into the signal. Furthermore, with a high output impedance, the gain control loads the output of the tone control circuit and affects the bass and treble boost and cut characteristics. Again, most available tone control circuits have a high output impedance.

Since most tone control circuits are attenuation circuits, there is a loss rather than a gain in signal strength, which degrades the signal to noise ratio of the system. Furthermore, most tone control circuits have a substantial phase shift variation as the control is varied. Since a music signal consists not only of fundamentals but many harmonics, this phase shift variation alters the phase relationship between the fundamentals and the harmonics. This substantially degrades the quality of the output signal.

SUMMARY OF THE INVENTION

According to the present invention, there is provided a tone control circuit which solves these problems in a manner unknown heretofore. The present tone control circuit utilizes an operational amplifier and a negative feedback circuit connected between the output and the input of the operational amplifier to provide a high input impedance, a low output impedance, substantial gain, and a relatively constant phase shift as the control is varied. The present tone control circuit incorporates a summing circuit which permits the summing of multiple inputs without distorting the pick up coils of an electric stringed instrument. The operational amplifier provides a virtual ground, thus preventing interference between such pick up coils. By providing a low output impedance, a long cable between the tone control circuit and an amplifier system does not act as an antenna and does not pick up noise, and the gain control does not load the tone control circuit. By providing substantial gain rather than attenuation, the present circuit provides a greater signal strength at the amplifier system, providing a better signal to noise ratio and minimizing noise. By providing a relatively constant phase shift, distortion of the relationship between fundamental and harmonic components is minimized.

Briefly, the present tone circuit comprises an operational amplifier having an input and an output and a negative feedback circuit connected between the output and the input, the feedback circuit comprising a first variable resistor, a second resistor having a manually movable tap, and a third resistor connected in series between the output and the input, a first capacitor connected across the first resistor, a fourth resistor connected between ground and a first junction between the first and second resistors a fifth resistor and a second capacitor connected in series between the manually movable tap of the second resistor and ground, and a third capacitor connected between the manually movable tap of the second resistor and a second junction between the second and third resistors. Movement of the movable tap of the second resistor towards the second junction increases the high frequency boost of the circuit whereas movement of the movable tap of the second resistor towards the first junction increases the high frequency cut of the circuit. Increasing the value of the first resistor increases the low frequency boost of the circuit. Where the circuit is used with a plurality of pick up coils, a relatively large value resistance is connected in series with each pick up coil, all of the series connected coils and resistors being connected in parallel between the input of the operational amplifier and ground.

OBJECTS

It is therefore an object of the present invention to provide a tone control circuit.

It is a further object of the present invention to provide a tone control circuit providing summing capabilities for multiple inputs.

It is a still further object of the present invention to provide a tone control circuit having a high input impedance.

It is another object of the present invention to provide a tone control circuit having a low output impedance.

It is still another object of the present invention to provide a tone control circuit which provides substantial gain.

Another object of the present invention is the provision of a tone control circuit providing a relatively constant phase shift.

Still other objects, features, and attendant advantages of the present invention will become apparent to those skilled in the art from a reading of the following detailed desciption of the preferred embodiment constructed in accordance therewith, taken in conjunction with the accompanying drawings wherein:

BRIEF DESCRIPTION OF THE DRAWINGS

The sole FIGURE is a circuit diagram of a tone control circuit constructed in accordance with the teachings of the present invention.

DESCRIPTION OF THE PREFERRED EMBODIMENT

Referring now to the drawings, the present tone control circuit, generally designated 10, is designed primarily for use in an electric stringed musical instrument, such as an electric guitar, and will be described in such environment. However, it will be apparent to those skilled in the art that tone control circuit 10 may be used in a variety of other applications.

Tone control circuit 10 receives its input signal from a plurality of pick up coils 11 and 12, first ends of which are connected together and to ground 13. The other ends of coils 11 and 12 are connected to resistors 14 and 15, respectively, all of the series connected coils and resistors being connected in parallel between ground 13 and one end of a coupling capacitor 16. The other end of coupling capacitor 16 is connected to the negative or inverting input terminal 17 of an operational amplifier 18. Operational amplifier 18 is a conventional operational amplifier having a theoretical infinite gain and which operates to invert the signal received at input terminal 17 and to deliver the amplified, inverted signal to its output terminal 19.

Power and bias for operational amplifier 18 is provided in a conventional manner. Thus, a source of d.c. voltage, B+, is connected to the positive power input terminal 20 of amplifier 18, the negative power input terminal 25 being connected to ground 13. The d.c. voltage source is also connected via a voltage divider network consisting of series connected resistors 21 and 22 to the positive or non-inverting input terminal 23 of amplifier 18 to establish the bias level thereof. A capacitor 24 is connected across resistor 22 to minimize noise at input terminal 23.

Connected between output 19 and input 17 of operational amplifier 18 is a negative feedback circuit, generally designated 30. Feedback circuit 30 includes a resistor 31 having a movable tap 32, one end 31A of resistor 31 being connected to output 19 of operational amplifier 18 and the other end 31B remaining unconnected. Resistor 31 operates as a variable resistor having a minimum value when tap 32 is at end 31A thereof and a maximum value when tap 32 is at end 31B thereof. Connected across resistor 31, between end 31A and movable tap 32, is a capacitor 33. A resistor 34 and a capacitor 35 are connected in series between ground 13 and the junction 36 between capacitor 33 and movable tap 32 of resistor 31. A resistor 37 and a resistor 32 are connected in series between junction 36 and input 17 of operational amplifier 18. Resistor 37 has a movable tap 47. A capacitor 39 is connected between tap 47 and the junction 40 between resistors 37 and 38. A resistor 41 and a capacitor 42 are connected in series between ground 13 and movable tap 47.

OPERATION

Tone control circuit 10, by using an operational amplifier 18, has a high input impedance, which is necessary to prevent distortion of the outputs of coils 11 and 12. Input 17 of operational amplifier 18 also provides a virtual ground to prevent interference between coils 11 and 12. Since an operational amplifier requires a very low input current, resistors 14 and 15 can have relatively high values, thereby satisfying the input impedance requirements of coils 11 and 12. Typical values for resistors 14 and 15 are 220 kilohms each.

The theory of operation of circuit 10 is that without feedback circuit 30, all frequencies are highly amplified and neither bass nor treble boost nor cut is provided. Feedback circuit 30, on the other hand, adjusts the amount of high and low frequencies that are fed back to input 17 to cancel a portion of the incoming signal so as to attenuate either the high or low frequencies. However, while feedback circuit 30 provides attenuation, it is done in combination with the gain of operational amplifier 18 so that the overall result is gain. In any event, by controlling the magnitude of the low and high frequency components that are fed back from output 19 to input 17 of operational amplifier 18, tone control circuit 10 provides either treble boost or cut and any desired degree of bass boost. Circuit 10 does not provide bass cut, which is not normally required.

Assume first that tap 32 is at end 31A of resistor 31. This has the effect of short-circuiting capacitor 33 and providing a direct connection between output 19 and junction 36. Furthermore, because of the relatively low output impedance of operational amplifier 18, the series connection of resistor 34 and capacitor 35, which is connected across such output impedance, has negligible effect and such components can also be considered to be out of the circuit. Under such conditions, the full signal at the output of operational amplifier 18 is fed back to junction 36 and via resistors 37 and 38 to reduce the overall gain of amplifier 18. On the other hand, movement of movable tap 47 of resistor 37 affects the magnitude of the high frequencies fed back to input 17 of operational amplifier 18 to provide treble boost or cut.

More particularly, with tap 47 at junction 40, capacitor 39 is short circuited and resistor 41 and capacitor 42 are connected between junction 40 and ground 13 to bleed a portion of the feedback signal to ground. At very low frequencies, the series impedance of resistor 41 and capacitor 42 is high compared to the resistance of resistor 37, functioning as an open circuit and permitting feedback of low frequencies to input 17 of operational amplifier 18. As the frequency increases, the series impedance of resistor 41 and capacitor 42 decreases, diverting more of the signal to ground 13, decreasing the feedback and increasing the gain of circuit 10. Thus, with tap 47 of resistor 37 at junction 40, circuit 10 operates as a high frequency boost circuit. The break point (the 3 db point) occurs where the series impedance of resistor 41 and capacitor 42 equals the resistance of resistor 37. With resistors 37 and 41 having values of 100 kilohms and 5 kilohms, respectively, and capacitor 42 having a value of 0.005 microfarads, the break point is 300 Hz. As the frequency increases above 300 Hz, boost increases at a 6 db per octave rate.

As movable tap 47 of resistor 37 moves towards junction 36, the amount of treble boost is decreased. With movable tap 47 at junction 36, resistor 41 and capacitor 42 are now in parallel with the series connection of resistor 34 and capacitor 35, across output 19 of operational amplifier 18. As explained previously, since the series impedance of resistor 41 and capacitor 42 is relatively high compared to the output impedance of operational amplifier 18, resistor 41 and capacitor 42 now have a negligible effect on the operation of circuit 10. At this point, the effective circuit between output 19 and input 17 of operational amplifier 18 is resistor 37 in parallel with capacitor 39, such parallel combination being in series with resistor 38.

Since the impedance of capacitor 39 decreases with increasing frequency, a greater signal is fed back from output 19 to input 17 of operational amplifier 18 as the frequency increases decreasing the overall gain of circuit 10, so that circuit 10 now operates as a treble cut circuit. Under such circumstances, the break point of the high frequency cut occurs when the impedance of capacitor 39 equals the resistance of resistor 37. With a value of 0.005 microfarads for capacitor 39, this break point also occurs at a frequency of 300 Hz. As the frequency increases above 300 Hz, cut increases at a 6 db per octave rate.

As movable tap 47 moves away from junction 36, the amount of treble cut is reduced. Obviously, a point is reached between junctions 36 and 40 where there is neither treble boost nor cut and the frequency response characteristics of circuit 10 is approximately flat. As movable tap 47 is moved in either direction from this flat point, any desired degree of treble boost or cut may be achieved between the maximum values which occur when movable tap 47 is at junction 36 or junction 40. It can also be seen that resistor 41, capacitors 39 and 42, and the position of tap 47 have negligible effects on frequencies below 300 Hz.

Assume now that movable tap 32 of resistor 31 is moved to end 31B thereof so that the full value of resistor 31 is connected between output 19 of operational amplifier 18 and junction 36. Ignoring for the present the effect of the treble boost and cut circuit and the effect of capacitor 35 and assuming that the resistance of resistor 31 is very high compared to the resistance of resistor 34, resistor 34 and resistor 31 operate as a voltage divider circuit. With the resistance of resistor 31 substantially greater than the resistance of resistor 34, a minimum signal is fed back to input 17 of operational amplifier 18, maximizing the gain of circuit 10.

Considering now the effect of capacitor 33, at very high frequencies, the impedance of capacitor 33 is very low compared to the resistance of resistors 31 and 34, effectively providing a short-circuit between output 19 and junction 36. Thus, regardless of the position of movable tap 32, feedback circuit 30 operates, as described previously, to boost or cut high frequencies. On the other hand, as the frequency decreases, the impedance of capacitor 33 increases. The break point of the circuit occurs when the parallel impedance of resistor 31 and capacitor 33 equals the resistance of resistor 34, providing an equal voltage division at junction 36. With resistors 31 and 34 having values of 100 kilohms and 5 kilohms, respectively, and capacitor 33 having a value of 0.1 microfarads, capacitor 33 has an effective impedance of 5 kilohms, at 300 Hz. Since 5 kilohms is substantially less than 100 kilohms, the effect of resistor 31 is negligible and the break point occurs at 300 Hz. As the frequency decreases below 300 Hz, the impedance of capacitor 33 increases and the bass boost increases at a 6 db per octave rate.

In other words, since the break points of the bass and treble controls are the same, the bass control, consisting of resistors 31 and 34 and capacitor 33, does not affect the treble control, consisting of resistors 37, 38, and 41 and capacitors 39 and 42, and vice versa. At frequencies below 300 Hz, resistors 31 and 34 and capacitor 33 provide any desired degree of bass boost, depending upon the position of movable tap 32. At frequencies above 300 Hz, resistors 37, 38, and 41 and capacitors 39 and 42 provide any desired degree of treble boost or cut depending upon the position of movable tap 47.

Capacitor 35 has negligible effect on the operation of either the bass or treble controls since it would have a large enough value to have a negligible impedance compared to that of resistor 34. A typical value for capacitor 35 would be 25 microfarads. Thus, capacitor 35 serves only as an a.c. short circuit and a d.c. open circuit to isolate junction 36 from the power supply B+.

Output 19 of operational amplifier 18 is connected via a coupling capacitor 43 to one end of a gain control resistor 44, the other end of which is connected to ground 13. Resistor 44 has a movable tap 45 which provides the output for circuit 10. Because of the low output impedance of operational amplifier 18, resistor 44 has a negligible loading effect on circuit 10 and does not effect the tone control characteristics thereof.

It can therefore be seen that according to the present invention, there is provided a tone control circuit 10 which solves the problems discussed previously in a manner unknown heretofore. Tone control circuit 10 utilizes an operational amplifier 18 and a negative feedback circuit 30 connected between output 19 and input 17 of amplifier 18 to provide a high input impedance, a low output impedance, substantial gain, and a relatively constant phase shift as movable taps 32 and 47 are varied. Tone control circuit 10 incorporates a summing circuit which permits the combining of multiple inputs without distorting pick up coils 11 and 12. Operational amplifier 18 provides a virtual ground at input 17, thus preventing interference between coils 11 and 12. By providing a low output impedance, a long cable between movable tap 45 and an amplifier system does not act as an antenna and does not pick up noise and gain control resistor 44 does not load circuit 10. By providing substantial gain rather than attenuation, circuit 10 provides a greater signal strength at the amplifier system, providing a better signal to noise ratio and minimizing noise. By providing a relatively constant phase shift, distortion of the relationship between fundamental and harmonic components is minimized.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:
1. A tone control circuit comprising:
   an operational amplifier having an input and an output; and
   a negative feedback circuit connected between said output and said input, said feedback circuit comprising:
      a first variable resistor, a second resistor having a manually movable tap, and a third resistor connected in series between said output and said input;
      a first capacitor connected across said first resistor;
      a fourth resistor connected between a first junction between said first and second resistors and ground;

a fifth resistor and a second capacitor connected in series between said manually movable tap of said second resistor and ground; and a third capacitor connected between said manually movable tap of said second resistor and a second junction between said second and third resistors.

2. A tone control circuit according to claim 1 wherein movement of said movable tap of said second resistor towards said second junction increases the high frequency boost of said circuit and movement of said movable tap of said second resistor towards said first junction increases the high frequency cut of said circuit.

3. A tone control circuit according to claim 2 wherein maximum high frequency boost occurs when said movable tap of said second resistor is at said second junction.

4. A tone control circuit according to claim 3 wherein the break point of said maximum high frequency boost occurs when the series impedance of said fifth resistor and said second capacitor equals the resistance of said second resistor.

5. A tone control circuit according to claim 4 wherein maximum high frequency cut occurs when said movable tap of said second resistor is at said first junction.

6. A tone control circuit according to claim 5 wherein the break point of said maximum high frequency cut occurs when the impedance of said third capacitor equals the resistance of said second resistor.

7. A tone control circuit according to claim 6 wherein increasing the value of said first resistor increases the low frequency boost of said circuit.

8. A tone control circuit according to claim 7 wherein the break point of said low frequency boost occurs when the parallel impedance of said first resistor and said first capacitor equals the resistance of said fourth resistor.

9. A tone control circuit according to claim 8 further comprising:
a plurality of pick up coils; and
relatively large value resistance connected in series with each pick up coil, all of said series connected coils and resistors being connected in parallel between said input of said operational amplifier and ground.

10. A tone control circuit according to claim 9 further comprising:
a coupling capacitor connected between said series connected coils and resistors and said input of said operational amplifier.

11. A tone control circuit according to claim 1 wherein increasing the value of said first resistor increases the low frequency boost of said circuit.

12. A tone control circuit according to claim 11 wherein the break point of said low frequency boost occurs when the parallel impedance of said first resistor and said first capacitor equals the resistance of said fourth resistor.

13. A tone control circuit according to claim 1 further comprising:
a plurality of pick up coils; and
relatively large value resistance connected in series with each pick up coil, all of said series connected coils and resistors being connected in parallel between said input of said operational amplifier and ground.

14. A tone control circuit according to claim 13 further comprising:
a coupling capacitor connected between said series connected coils and resistors and said input of said operational amplifier.

* * * * *